United States Patent [19]

Maenishi

[11] Patent Number: 5,560,533

[45] Date of Patent: Oct. 1, 1996

[54] MOUNTED CIRCUIT BOARD PRODUCING SYSTEM

[75] Inventor: Yasuhiro Maenishi, Kofu, Japan

[73] Assignee: Matsushita Electric Industrial Co., Ltd., Osaka-fu, Japan

[21] Appl. No.: 497,403

[22] Filed: Jun. 30, 1995

[30] Foreign Application Priority Data

Jun. 30, 1994 [JP] Japan ................................ 6-149929

[51] Int. Cl.⁶ .................................................. H05K 3/34
[52] U.S. Cl. .................................. 228/8; 228/102
[58] Field of Search ........................ 228/102, 104, 228/105, 180.21, 8, 9; 29/840

[56] References Cited

U.S. PATENT DOCUMENTS

| 4,653,682 | 3/1987 | Dines et al. ............... | 228/180.21 |
| 4,677,473 | 6/1987 | Okamoto et al. ........... | 228/105 |

FOREIGN PATENT DOCUMENTS 6-112295  4/1994  Japan .

*Primary Examiner*—Samuel M. Heinrich
*Attorney, Agent, or Firm*—Wenderoth, Lind & Ponack

[57] ABSTRACT

A mounted circuit board producing system includes a plurality of mounted circuit board production lines having a solder printing unit, a component mounting unit, and a soldering unit. The system includes an inspection device for inspecting at least one equipment at the solder printing unit, component mounting unit, and soldering unit and given monitor items with respect to circuit boards to be mounted, a data analyzing part for analyzing, according to a warning criterion applicable prior to a predetermined defective judgement criterion being reached, qualitative conditions of both the equipment and individual circuit boards from results of inspections made by the inspection device, and a control device for controlling, on the basis of analysis results at the data analyzing part, at least one of the solder printing unit, component mounting unit, and soldering unit for a change of operating conditions over the entire production line.

9 Claims, 16 Drawing Sheets

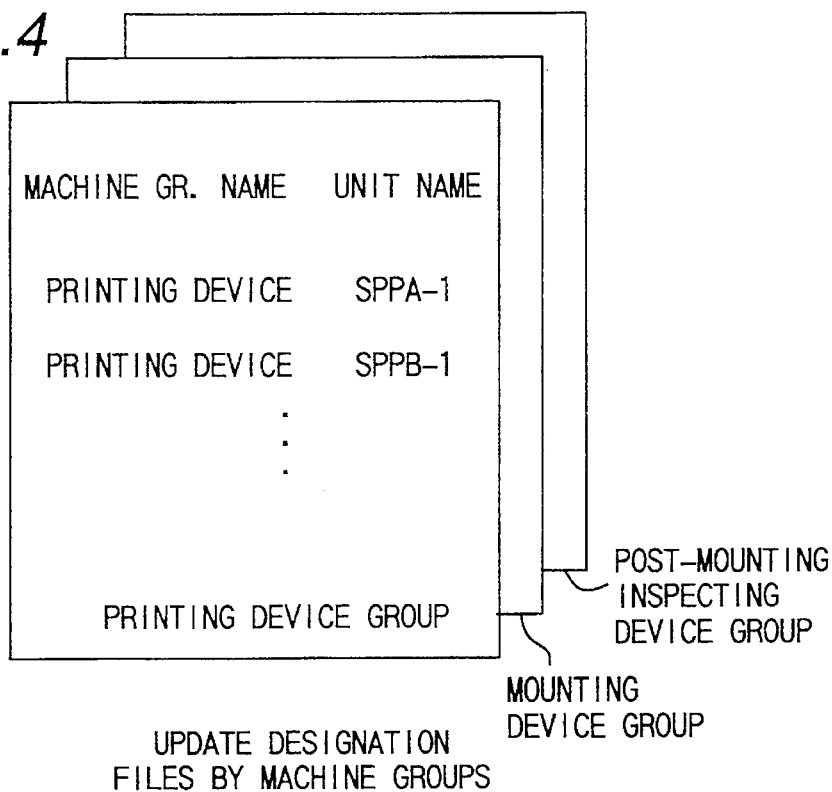
Fig.4 UPDATE DESIGNATION FILES BY MACHINE GROUPS
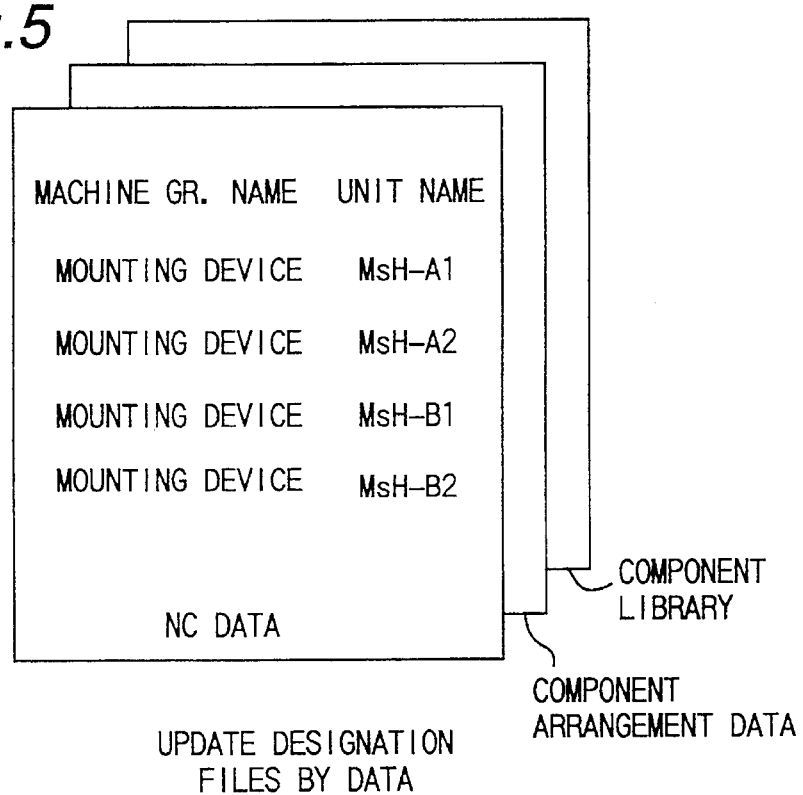
Fig.5 UPDATE DESIGNATION FILES BY DATA

Fig.16

| BAR CODE | CIRCUIT NUMBER | ANALYSIS OF CORRELATION OF INTER-PROCESS BASED ON INSPECTION RESULT | | | |
|---|---|---|---|---|---|
| | | PRINTING INSPECTION | MOUNTING INSPECTION | SOLDERING INSPECTION | — — |
| xxxxx | xx | BLUR(SECOND) | OK | BRIDGE(FIRST) | |
| | xx | OK | SHIFT(SECOND) | SHIFT(FIRST) | |
| | xx | BLUR(SECOND) | SHIFT(SECOND) | MANHATTAN PHENOMENON(FIRST) | |
| xxxxx | xx | • | • | • | |
| | xx | • • • | • • • | • • • | |
| | | • • • | • • • | • • • | |

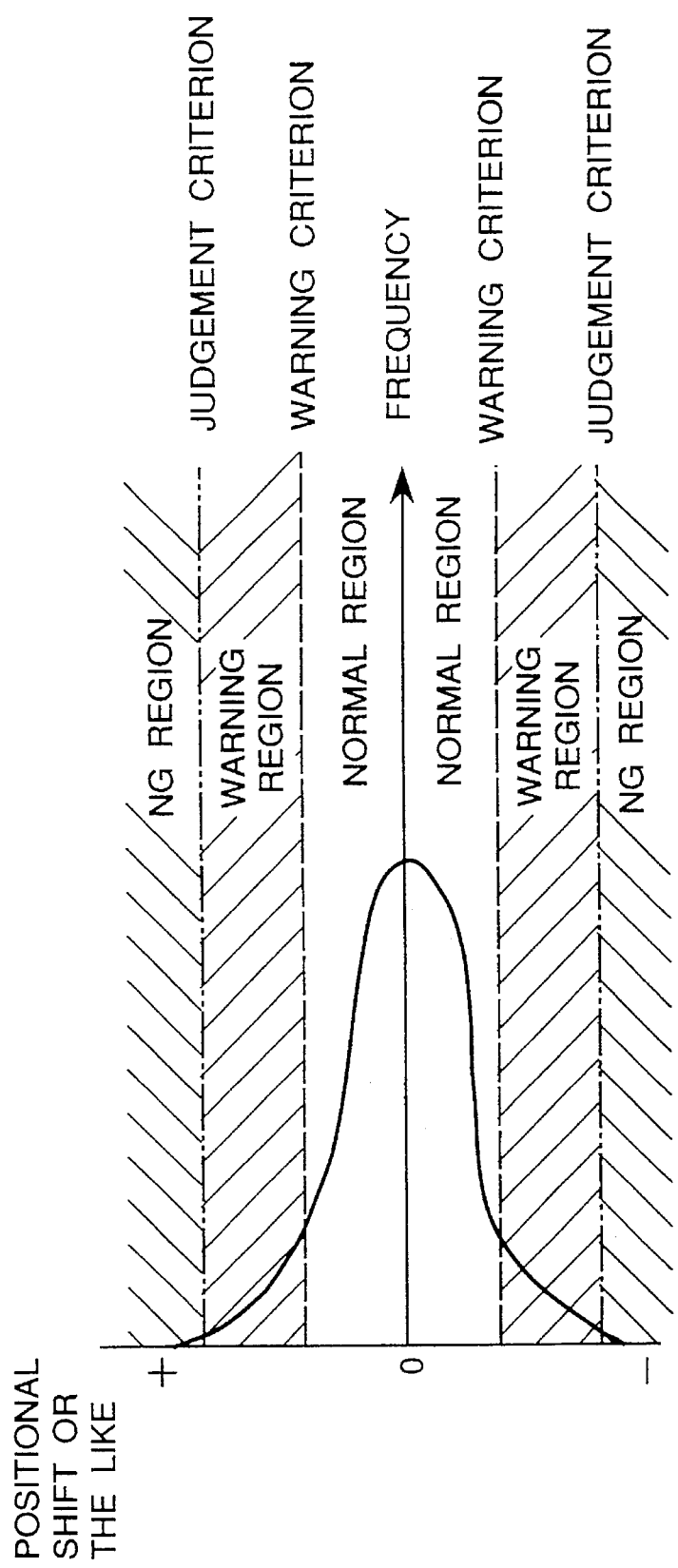

5,560,533

MOUNTED CIRCUIT BOARD PRODUCING SYSTEM

BACKGROUND OF THE INVENTION

The present invention relates to a mounted circuit board producing system including a plurality of mounted circuit board production lines for mounting components on circuit boards.

A prior art example of a mounted circuit board production line for mounting components on circuit boards is described in Japanese Patent Application No. 4-260449 (published as Laid-Open Publication No. 6-112295), entitled "Mounted Circuit Board Producing System".

The prior art mounted circuit board production system of Japanese Patent Application No. 4-260449 is explained hereinbelow with reference to FIGS. 17 and 18, 7 through 16.

In FIG. 17, the mounted circuit board production line includes a solder printing unit 1, a component mounting unit 2, and a soldering unit 3 sequentially arranged therein.

Initially, a solder paste printing device 4 at the solder printing unit 1 prints solder paste on a land of a circuit board. Then, a mounting device 8 at the component mounting unit 2 mounts components in place so that leads for the components and electrodes are positioned on the solder paste printed lands. Finally, a reflow furnace 12 at the soldering section causes the solder paste to reflow to solder-joint the leads for the mounted parts and the electrodes to the land of the circuit board.

In connection with the foregoing operation, various inspections are carried out. A solder paste printing inspecting device 5 at the solder printing unit 1 performs inspection with respect to monitor items for the solder paste printed on the lands of the circuit board, including, for example, thin print, print shift (print displacement), and presence or absence of print solder, and also with respect to monitor items for the circuit boards and the solder paste printing device 4, including, for example, circuit board mark shift amount and screen mark shift amount.

A post-mounting component inspecting device 9 at the component mounting unit 2 performs inspection with respect to monitor items for components which are mounted on the circuit board by the mounting device 8, such as component lacking, component rising, component out of position, and component mounted with mispolarity, and also with respect to monitor items for the mounting device 8, such as suction error and recognition error at suction nozzle.

Further, a soldering inspecting device 13 at the soldering unit 3 performs inspection with respect to monitor items for soldered condition of components on the circuit board, such as component lacking, component rising, component out of position, and component mounted with mispolarity, and also inspection with respect to monitor items for the reflow furnace 12, such as heater temperature, conveyor velocity, and oxygen concentration.

On the basis of the results of the foregoing inspections, quality control is carried out by data holding parts 6, 10, 14 and data analyzing parts 7, 11, 15 of a control part 17, details of which are as follows.

For the solder printing unit 1, the printing data holding part 6 collects and holds inspection data on monitor items at the solder paste printing inspecting device 5, and the printing data analyzing part 7 carries out collective analyses and time series analyses, by monitor items, by circuits, and by equipment units, with respect to inspection data on monitor items which are held by the printing data holding part 6. Thus, as FIG. 18 shows, particulars as to equipment condition at, and quality aspect of circuit boards at the solder printing unit 1, are grasped on the basis of the results of comparison of data obtained from such analyses with predetermined warning criteria for respective monitor items.

For the parts mounting unit 2, the mounting data holding part 10 collects and holds inspection data on monitor items at the post-mounting component inspecting device 9, and the printing data analyzing part 11 carries out collective analyses and time series analyses, by monitor items, by circuits, and by equipment units, with respect to inspection data on monitor items which are held by the mounting data holding part 10. Thus, as FIG. 18 shows, particulars as to equipment condition at, and quality aspect of circuit boards at the component mounting unit 2, are grasped on the basis of the results of comparison of data obtained from such analyses with predetermined warning criteria for respective monitor items.

For the soldering unit 3, the soldering data holding part 14 collects and holds inspection data on monitor items at the soldering inspecting device 13, and the soldering data analyzing part 15 carries out collective analyses and time series analyses, by monitor items, by circuits, and by equipment units, with respect to inspection data on monitor items which are held by the soldering data holding part 14. Thus, as FIG. 18 shows, particulars as to equipment condition at, and quality aspect of circuit boards at the soldering unit 3, are grasped on the basis of the results of comparison of data obtained from such analyses with predetermined warning criteria for respective monitor items.

The manner of quality control operation according to the warning criteria shown in FIG. 18 will be explained hereinbelow. Between a normal region and an NG region beyond a criterion for judgement of defects there is established a warning criterion, and the region between the judgement criterion and the warning criterion is taken as a warning region. With respect to inspection data on a monitor item, a detection is made whether the data has entered the warning region across the warning criterion. In case of such an entry having been made, operation of equipment is controlled so that operation can quit the warning region to return to the normal region.

An example is shown in FIGS. 7 to 12.

FIG. 7 shows an example of print inspection error analysis by circuit numbers with respect to monitor items, such as soldering lack and soldering blur, at the solder printing unit 1, with warning criteria and judgement criteria established according to cumulative percentages of soldering lack and soldering blur cases which have entered the warning region. In the FIG. 7 case, circuit No. N413 whose cumulative percentage of entry into the warning region is highest of all is still outside the warning criteria. When such cumulative percentage has exceeded the warning criteria, maintenance instructions with respect to equipment and circuit boards are given to cause various checks to be carried out, including squeegee checks such as squeegee pressure and inclination checks, circuit board (PCB) checks such as land position accuracy and flatness checks, and screen checks such as position and pressing amount checks. Then, operation of equipment is modified so that the inspection results will come within the normal region.

FIG. 8 shows an example of time series analysis of inspection results with respect to monitor items for "soldering positional shift (in X direction)" at the solder printing unit 1, with warning criteria set at ±0.1 mm and judgement criteria at ±0.2 mm. Although measurement results are within the normal region in FIG. 8, circuit, when inspection measurements exceed the warning criteria, maintenance instructions with respect to the equipment and circuit boards are given to cause various checks to be carried out, including squeegee checks, circuit board checks, and temperature checks, and also to cause various operations to be executed, including print offset changing, adjustment of squeegee pressure, etc., and cleaning operation against screen blinding and the like. Then, operation of equipment is modified so that the inspection results will come within the normal region.

FIG. 9 shows an example of by-nozzle error rate with respect to monitor items, such as absence of suction, suction in oriented state, suction in rotating state, recognition error, and abnormal recognition, at the component mounting unit 2, with warning criteria and judgement criteria established according to cumulative percentages of such items as "absence of suction", "suction in oriented state", "suction in rotating state", "recognition error", and "abnormal recognition", which have entered the warning region. In the FIG. 9 case, nozzle Nos. 4, 5, and 8 have exceeded the warning criteria, and accordingly maintenance instructions with respect to the equipment and the circuit boards are given to cause various checks to be carried out, including nozzle cleaning checks and cassette checks, and also to cause various operations to be carried out, including filter replacement against filter blinding, and nozzle cleaning. Then, operation of equipment is modified so that the inspection results will come within the normal region.

FIG. 10 shows an example of time series analysis of inspection results with respect to monitor items for "component positional shift (in X direction)" at the component mounting unit 2, with warning criteria set at ±0.2 mm and judgement criteria at ±0.38 mm. Although the measurement results are within the normal region, when inspection measurements exceed the warning criteria, maintenance instructions with respect to the equipment and the circuit boards are given to cause various checks to be carried out, including checks of reference pins for positioning in holes of circuit boards and nozzle cleaning checks, and also to cause shift amount corrections to be made, including data offset corrections with respect to mounting position NC data. Then, operation of equipment is modified so that the inspection results will come within the normal region.

FIG. 11 shows an example of solder inspection error cumulative percentages by circuit numbers with respect to monitor items, such as small height of component, rotational shift in right direction, rotational shift in left direction, bridge defective, and edge detection defective at the soldering unit 3, with warning criteria and judgement criteria established according to cumulative percentages of such items as "small height of component", "rotational shift in right direction", "rotational shift in left direction", "bridge defective", and "edge detection defective" which have entered the warning regions. In the case of FIG. 11, circuit board No. N413 whose cumulative percentage of entry into the warning region is highest of all exceeds the warning criteria and accordingly maintenance instructions with respect to the equipment and the circuit boards are given to cause checks to be carried out, including solder checks, PCB checks, and furnace temperature profile checks, and also to cause changes to be made, including heater temperature change, conveyor speed change, and $N_2$ quantity change. Then, operation of equipment is modified so that the inspection results will come within the normal region.

FIG. 12 shows an example of time series analysis of inspection results with respect to monitor items for "component positional shift (in X direction)" at the soldering unit 3, with warning criteria set at ±0.1 mm and judgement criteria at ±0.2 mm. The measurement results are in excess of the warning criterion of ±1 mm, and accordingly maintenance instructions with respect to the equipment and the circuit boards are given to cause checks to be carried out, including profile checks, PCB checks, and solder checks, and also to cause corrections of reflow conditions to be made, including heater temperature changes. Then, operation of equipment is modified so that the inspection results will come within the normal region.

On the basis of the foregoing inspection data analysis results, a correlation analyzing part 16 at the control part 17 will perform quality control operations as detailed below.

On the basis of analysis data from printing data analyzing part 7, mounting data analyzing part 11, and soldering data analyzing part 15, the correlation analyzing part 16 analyzes correlations of defective factors for defect occurrences at various processes with respect to monitor items. Then, on the basis of the analysis results of such correlations, the correlation analyzing part 16 issues an operation control instruction to at least one of the solder paste printing device 4, mounting device 8, and reflow furnace 12 for a dynamic change of operation to thereby increase the yield of acceptables.

By way of example, monitor items for chip orientation (manhattan phenomenon) are taken up for explanation of correlations between various processes. If the rate of heating at the reflow furnace 12 is increased too much, an abrupt rise will occur with the solder temperature. In this case, if there is any solder print shift or component mounting shift, terminals 19 of a chip component 18 are mounted offset from the position of solder 20 and then, as a result of such abrupt change in the solder temperature, its smaller volume side of solder 20 melts first. Accordingly, the terminals 19 are drawn under the surface tension of the solder, so that there occurs a chip orientation condition, as shown in FIG. 13.

FIG. 14 shows a chart of defective factors. The solder paste printing process, component mounting process, and $N_2$ reflow process all involve factors for a chip orientation defect. However, in order that a chip orientation defect may be detected in the inspection process, a component must be mounted, which takes place in the component mounting process and $N_2$ reflow process. Therefore, the presence of any chip orientation defect as monitor item is checked by inspecting the component mounting process and $N_2$ reflow process. When, at these processes, the frequency of chip orientation defect occurrences exceeds the warning criterion, maintenance instructions are given with respect to the equipment and the circuit boards for the correction of chip orientation defects. Such instructions are given for correction with respect to print shift, print thickness, etc., when given to the solder paste printing process; for correction with respect to mounting shift, fitting-in. etc. when given to the component mounting process; and for improvement heating rate, air velocity, etc. when given to the $N_2$ reflow process. In this way, conditions of operation of respective equipment units are dynamically changed so as to eliminate chip orientation defects.

Conversely, when inspection results at the solder paste printing process are in the warning region, if any print shift, for example, is found in excess of the warning criterion, in order to prevent the occurrence of any chip orientation defect at the component mounting process and $N_2$ reflow process, on the downstream side of this detection process, dynamic controls with respect to equipment are effected for correcting the component mounting position at the component mounting process so as to nullify the detected print shift, and for reducing the heating velocity at the $N_2$ reflow process. Results of collective analysis and time series analysis of inspection data by the analyzing parts 7, 11, 15 of the control part 17 with respect to the foregoing monitor items, and also of distribution analysis of inspection analysis values as shown in FIG. 15 (analysis of component mounting positional shifts in FIG. 15), together with inter-process relationship analysis results of defective factors with respect to the monitor items of each process which are based on the analysis results with respect to the inspection data and obtained by the correlation analyzing part 16, are incorporated, in parallel with production, into a data base, and this permits monitor display and copying. Thus, it is possible to quickly carry out various analyses, such as quality trend analysis, historical quality analysis, and quality source analysis, for any period of time, thereby to promptly grasp causes of defects. Through repetition of these operations it is possible to provide warning criteria on the basis of which the analyzing parts 7, 11, 15 and correlation analyzing part 16 are caused to carry out quality control, whereby proper measures for defect prevention can be carried out prior to the occurrence of any defect.

In the examples shown in FIGS. 13 and 14, correlation analysis by the correlation analyzing part 16 is explained with respect to a chip orientation defect called "Manhattan phenomenon". Several monitor items are involved such as "solder bridge" and "component positional shift". With respect to any monitor item such that the cause of defect exists over some processes, correlation analyses can be carried out by the correlation analyzing part 16 with good effect as shown in FIG. 15.

In FIG. 16, "(first)" refers to inspection under defect judgement criteria, and "(second)" refers to inspection under warning criteria. That is, quality control operations through inter-process correlation analysis of inspection results, as shown in FIG. 16, are carried out in such a way that in printing and mounting inspections, inspection is made according to the warning criteria, and in soldering inspections, inspection is made according to the defect judgement criteria.

Use of such criteria is advantageous in that where "solder blur" exceeds the warning criterion during a printing inspection but is within the normal region during a mounting inspection, maintenance care is effected with respect to the equipment and circuit boards on the basis of such excess found over the warning criterion during the printing inspection, whereby the mounting inspection is passed and possible occurrence of any solder bridge defect can be prevented during the process of a soldering inspection.

Where a printing inspection is passed but "mounting shift" exceeds the warning criteria during a mount inspection, maintenance care is effected with respect to the equipment and circuit boards on the basis of such excess found over the warning criterion during the mounting inspection, whereby possible occurrence of any chip shift can be prevented during the process of a soldering inspection.

Where "solder blur" exceeds the warning criterion during a printing inspection and "mounting shift" exceeds the warning criterion during a mounting inspection, maintenance care is effected with respect to the equipment and circuit boards on the basis of such excess found over the warning criterion during the printing inspection, and of such excess found over the warning criterion during the mounting inspection, whereby possible occurrence of any "Manhattan phenomenon" can be prevented during the process of a soldering inspection.

Setting of above described monitor items need not be made with respect to all processes and, therefore, it may be arranged that monitor items are set for any selected processes so that operation control instructions may be given with respect to the selected processes.

According to the above described prior art arrangement, quality control on the basis of inspection data analysis by the data analyzing part with respect to the monitor items, and quality control on the basis of the result of correlation analysis by the correlation analyzing part with respect to individual processes involved, are carried out for each production line of the mounted circuit board production system 1. Therefore, inspection data to be used for quality control purposes are limited to only data available within each particular production line per se. As a result, available inspection data are small in number, so that too much time is required for accumulation of inspection data before any quality control can be effectively made on the basis of correlation analysis results.

In particular, a flexible production system in which a large variety of products are produced in limited quantities involves an issue such that the lack of inspection data does not permit effective quality control by correlation analysis results.

Where some trouble has occurred in a mounted circuit board producing system having a plurality of mounted circuit board production lines, so that changes are required with operating programs, libraries, circuit board producing conditions, and inspection conditions, for each line, it is necessary to analyze actual production data and inspection data of the particular line in which the trouble or the like has occurred and then carry out the above changes with the line and, in addition, to separately analyze actual production data and inspection data of the other lines and separately carry out such related changes.

SUMMARY OF THE INVENTION

An object of the present invention is to provide a mounted circuit board production system for common use, between a plurality of lines of approximately identical construction, of inspection data analysis results and inter-process correlation analysis results obtained with the plural lines.

In accomplishing these and other objects, according to one aspect of the present invention, there is provided a mounted circuit board producing system including a plurality of mounted circuit board production lines having a solder printing unit, a component mounting unit, and a soldering unit, the system comprising:
inspection means for inspecting at least one equipment at the solder printing unit, component mounting unit, and soldering unit and given monitor items with respect to circuit boards to be mounted;
a data analyzing part for analyzing, according to a warning criterion applicable prior to a predetermined defective judgement criterion being reached, qualitative conditions of both the equipment and individual circuit boards from results of inspections made by the inspection means; and control means for controlling, on the basis of analysis results at the data analyzing part, at least one of the solder printing unit, component mounting unit, and soldering unit for a change of operating conditions over the entire production line.

According to another aspect of the present invention, there is provided a mounted circuit board producing system including a plurality of mounted circuit board production lines having a solder printing unit, a component mounting unit, and a soldering unit, the system comprising:

change detection means for detecting a change made in an operation program and/or a library with respect to equipment at one of the solder printing unit, component mounting unit, and soldering unit, a change in a condition for production of circuit boards to be mounted, and a change in an inspection condition; and notification means for notifying associated equipment, predetermined for various types of changes, of particulars detected by the change detection means including changes which are based on the changes in the operation program and/or the library, and on the changes in condition for production of circuit boards to be mounted.

BRIEF DESCRIPTION OF THE DRAWINGS

These and other aspects and features of the present invention will become clear from the following description taken in conjunction with the preferred embodiments thereof with reference to the accompanying drawings, in which:

FIG. 4 is a view showing an update designation file, by machine group, as used in the third embodiment of the invention;

FIG. 5 is a view showing a by-data update designation file as used in the third embodiment of the invention;

FIG. 16 is a check results inter-process correlation analysis chart used in the embodiments;

FIG. 18 is a view showing warning criteria on "positional shift", etc. as used in the prior art and embodiments.

DETAILED DESCRIPTION OF THE PREFERRED EMBODIMENTS

Figure 1:
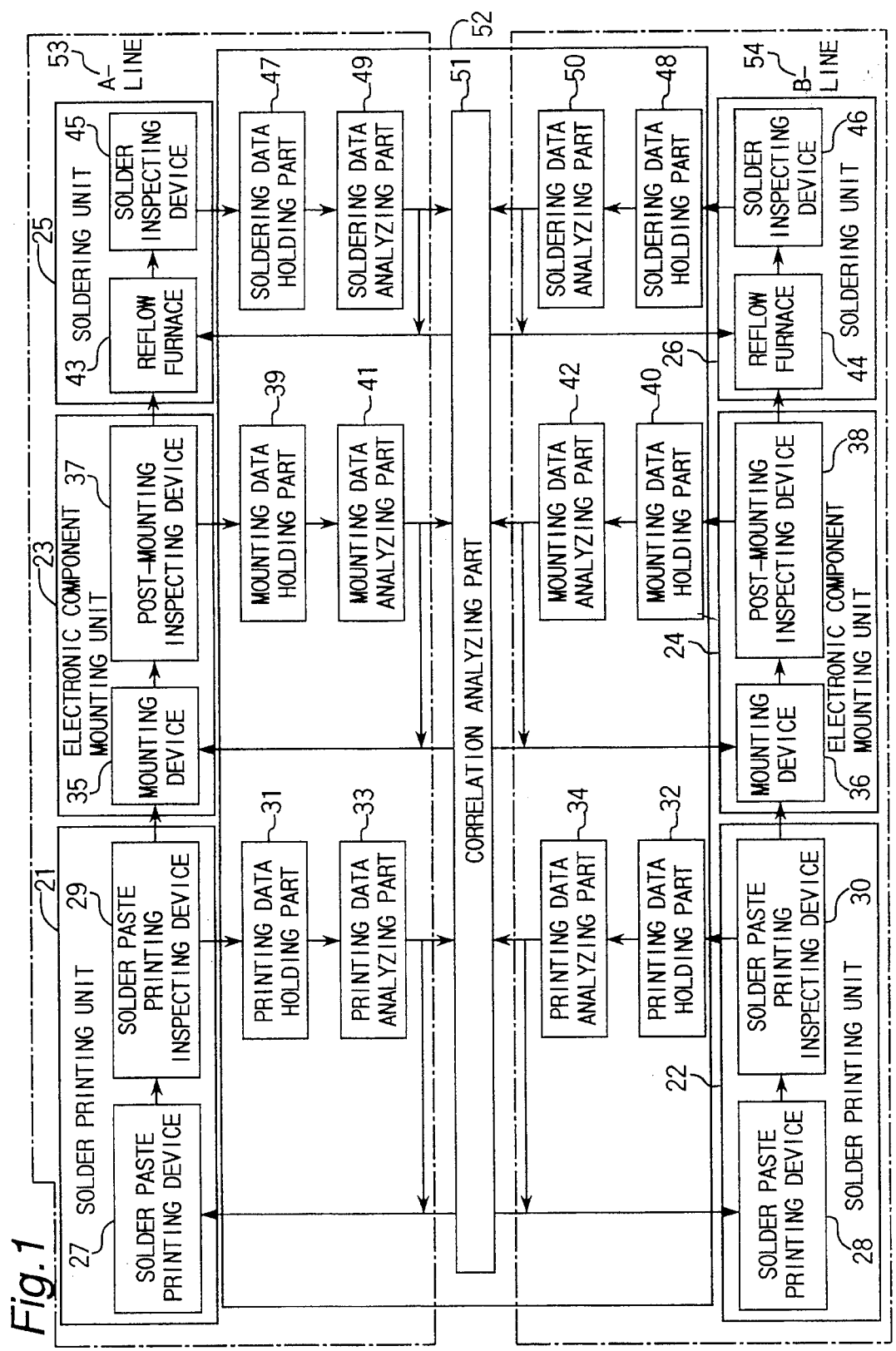
FIG. 1 is a block diagram showing the arrangement of a first embodiment of the present invention.

Before the description of the present invention proceeds, it is to be noted that like parts are designated by like reference numerals throughout the accompanying drawings.

FIG. 1 illustrates the arrangement of a mounted circuit board producing system according to a first embodiment of the present invention.

The embodiment shown in FIG. 1 comprises two mounted circuit board production lines including A-line 53 and B-line 54, each having production equipment, an inspecting device, an inspection data holding part, and an inspection data analyzing part which feed-back controls the processes of the line, and a correlation analyzing part 51 which feed-back controls respective processes over both A- and B-lines 53, 54, on the basis of correlation analyzing data obtained through the correlation analysis of the inspection data analysis results obtained from the inspection data analyzing parts at the respective processes.

In each of the two mounted circuit board production lines, A-line 53 and B-line 54, the production equipment, the inspecting device, and the inspection data holding part, and the inspection data analyzing part which feed-back controls the respective processes for each process are of same arrangement and of same function as those in the prior art. The correlation analyzing part 51, unlike the conventional correlation analyzing part 16, is operative to combine with the inspection data holding part and inspection data analyzing part of each of the A- and B-lines to constitute a control means 52. The correlation analyzing part 51 is also operative to feed-back control each process, over A- and B-lines, on the basis of the inspection data analysis results from the inspection data analyzing part for each process of the A- and B-lines and correlation analysis results obtained by the correlation analyzing part 51 after carried out correlation analysis based on the inspection data analysis results.

The two mounted circuit board production lines, A-line 53 and B-line 54, are identical in function, each line having solder printing devices 27, 28, component mounting units 23, 24, and soldering units 25, 26 sequentially arranged therein.

Each of solder paste printing devices 27, 28 at each of the solder printing units 21, 22 prints solder paste on a land of the circuit board; then, each of mounting devices 35, 36 at each of the component mounting units 23, 24 mounts a component in position in such a manner that leads for the component and electrodes are positioned on the land on which a solder is printed; and finally, each of reflow furnaces 43, 44 in each of the soldering units 25, 26 solder-bonds component leads and electrodes, mounted in position by solder paste reflowing, with the land of the circuit board.

In this connection, each of solder paste printing inspecting devices 29, 30 at each of the solder printing units 21, 22 inspects monitor items for solder paste, printed on the land of the circuit board, such as thin print, print shift, and presence/absence of print solder, and monitor items for circuit boards and solder paste printing devices 27, 28, such as circuit board mark shift amounts and screen mark shift amounts.

Each of component post-mounting inspecting devices 37, 38 at each of component mounting units 23, 24 will inspect monitor items with respect to components which are mounted to the circuit board by each of mounting devices 35, 36, such as component lacking, component rising, component positional shift, and component mounted with mispolarity, and also inspect monitor items for each of the mounting devices 35, 36, such as suction error with suction nozzle, recognition error, etc.

Further, each of soldering inspecting devices 45, 46 at each of soldering units 25, 26 will inspect monitor items with respect to components, mounted by each of the mounting devices 35, 36 to the circuit board, such as component lacking, component rising, component out of position, component mounted with mispolarity, and will also inspect monitor items at each of reflow furnaces 43, 44, such as heater temperature, conveyor velocity, and oxygen concentration.

On the basis of the results of the foregoing inspections, data holding parts 31, 32, 39, 40, 47, 48 and data analyzing parts 33, 34, 41, 42, 49, 50 at control means 52 will perform quality control operations as detailed below.

Figure 6:
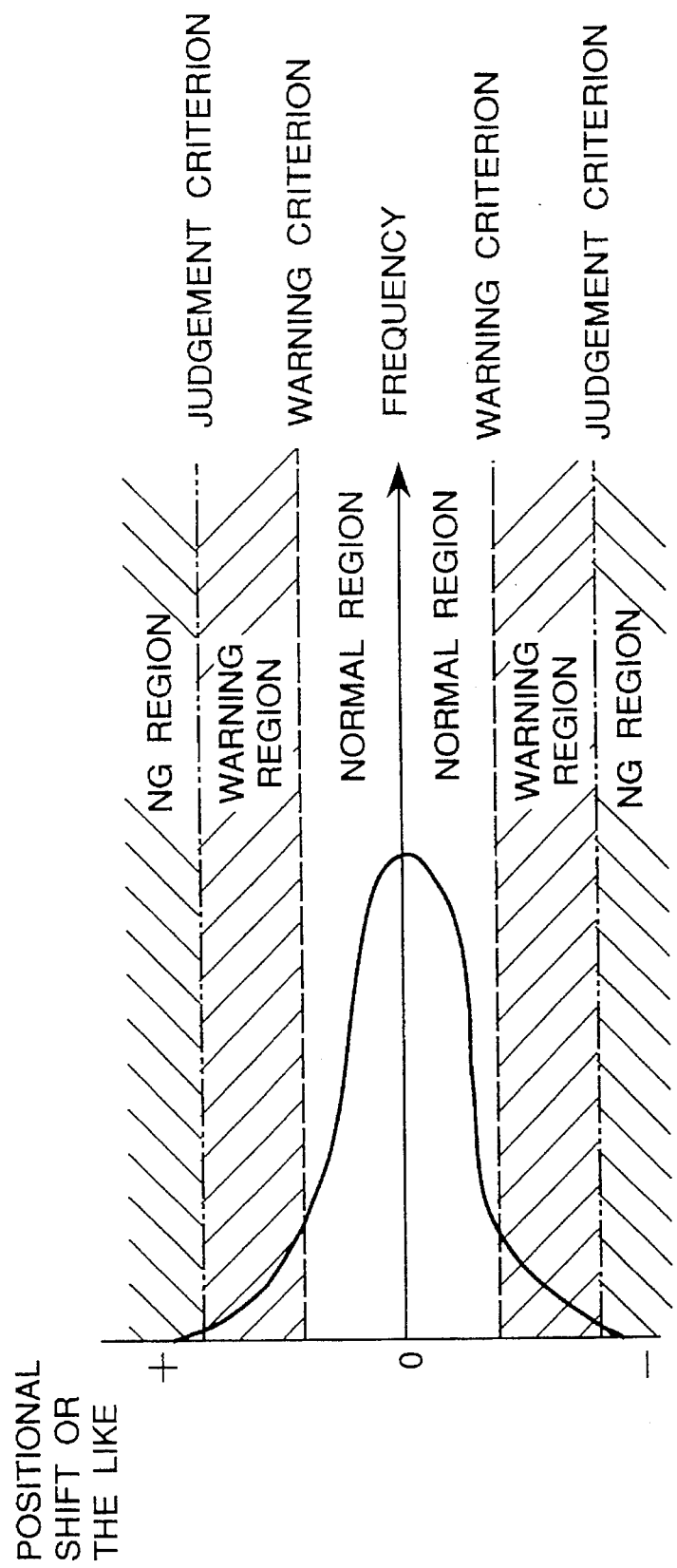
FIG. 6 is a view showing warning criteria on "positional shift", etc. as used in the embodiments.
Figure 7:
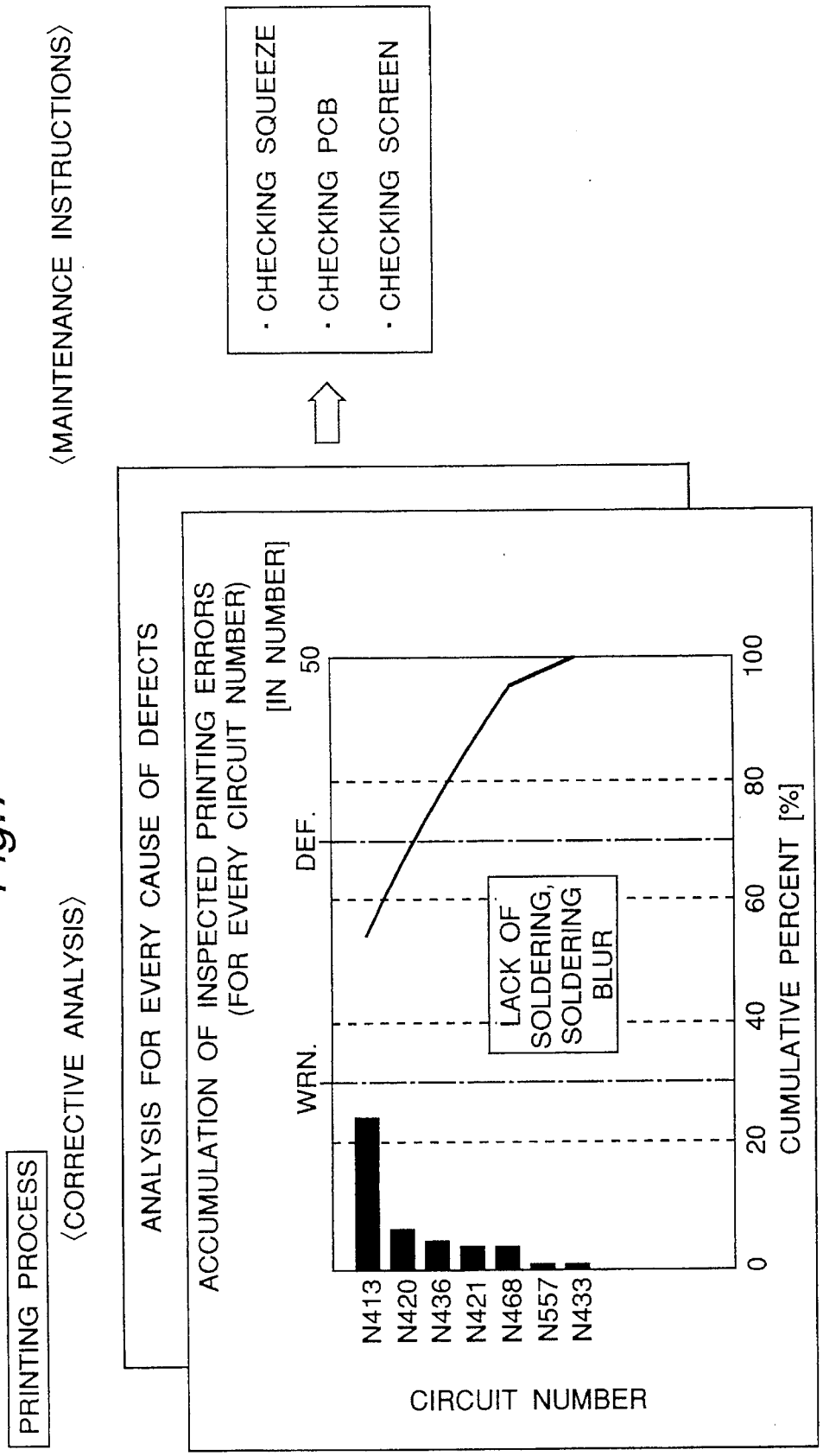
FIG. 7 is a printing-process monitor chart used in the embodiments.
Figure 8:
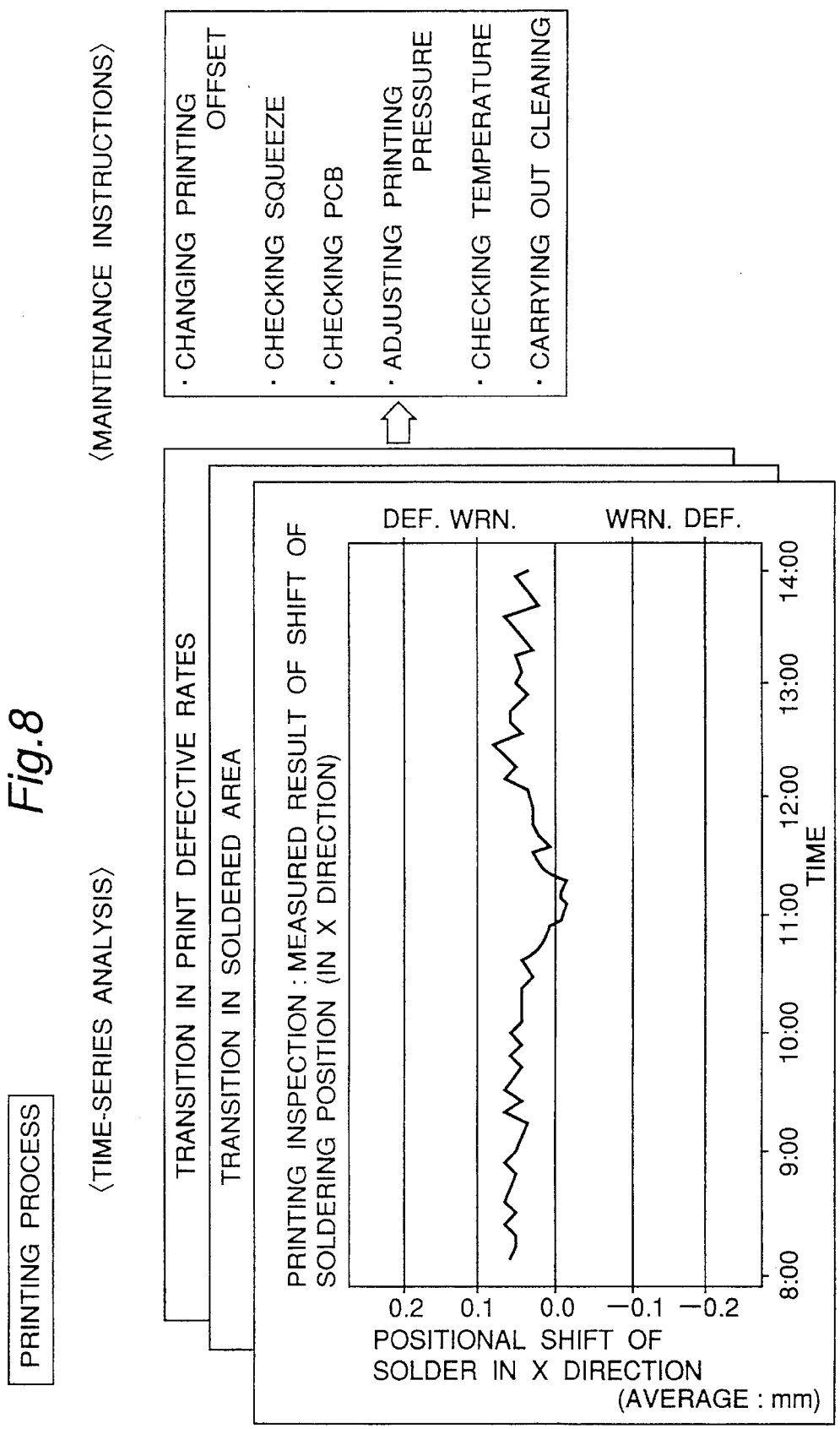
FIG. 8 is a printing-process monitor chart used in the embodiments.
Figure 9:
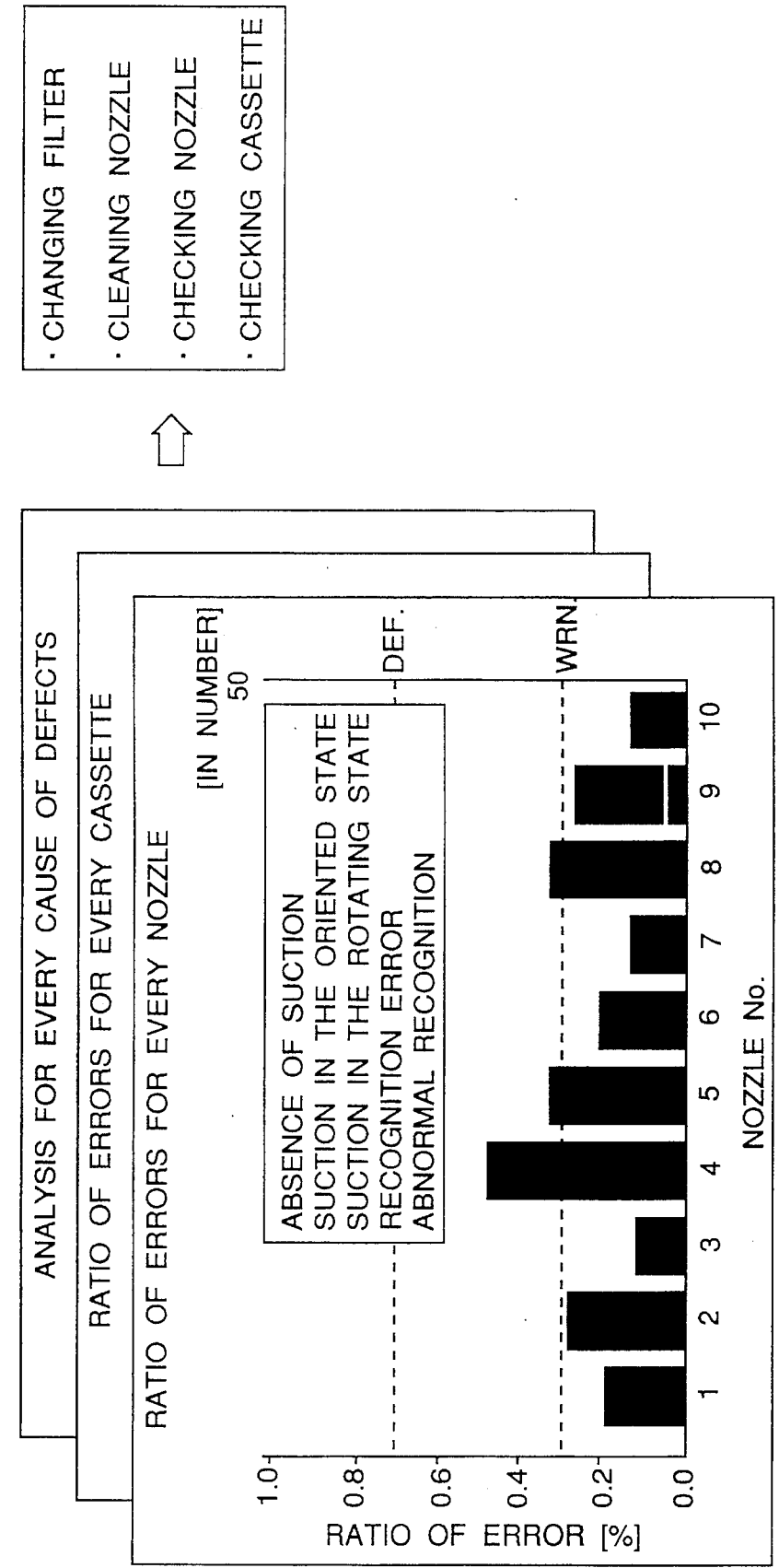
FIG. 9 is a mounting-process monitor chart used in the embodiments.
Figure 10:
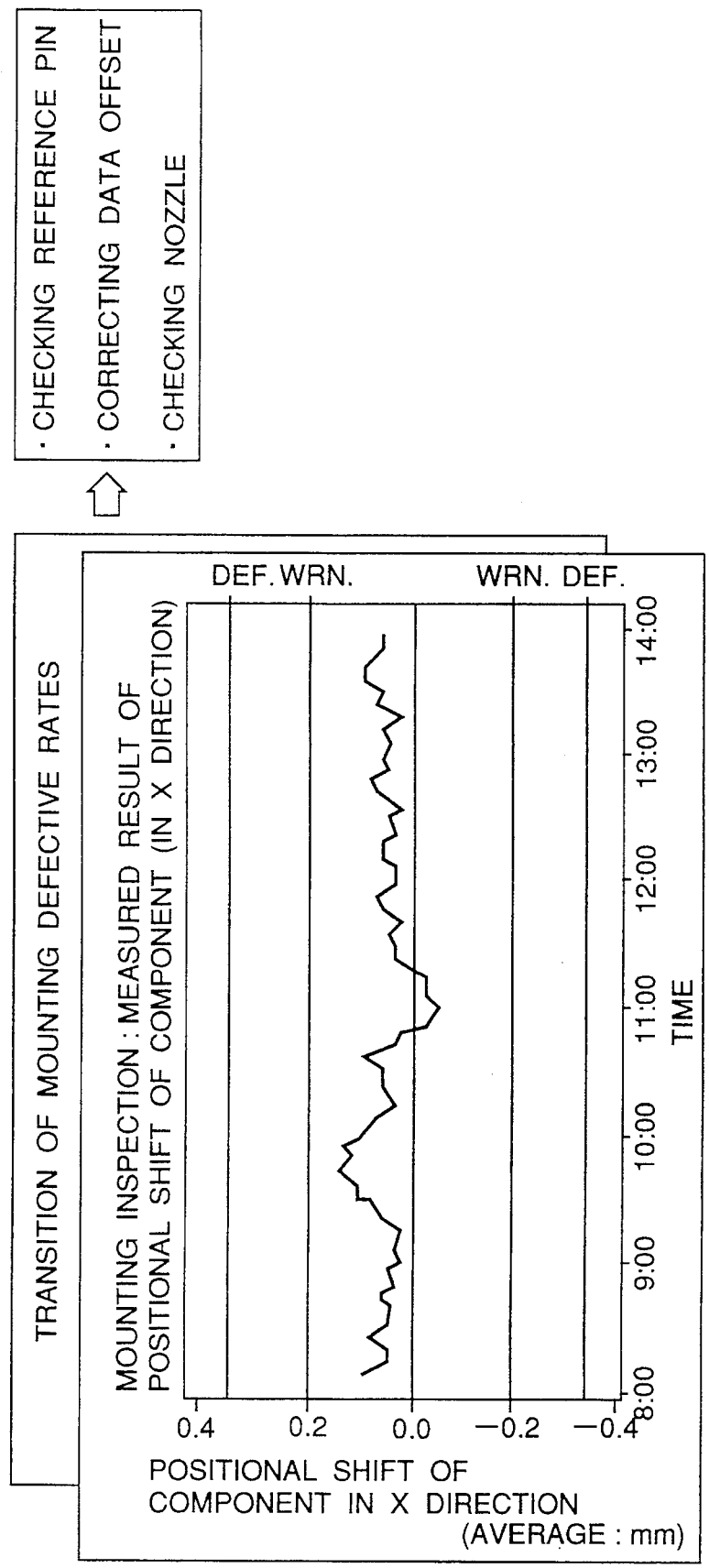
FIG. 10 is a mounting-process monitor chart used in the embodiments.
Figure 11:
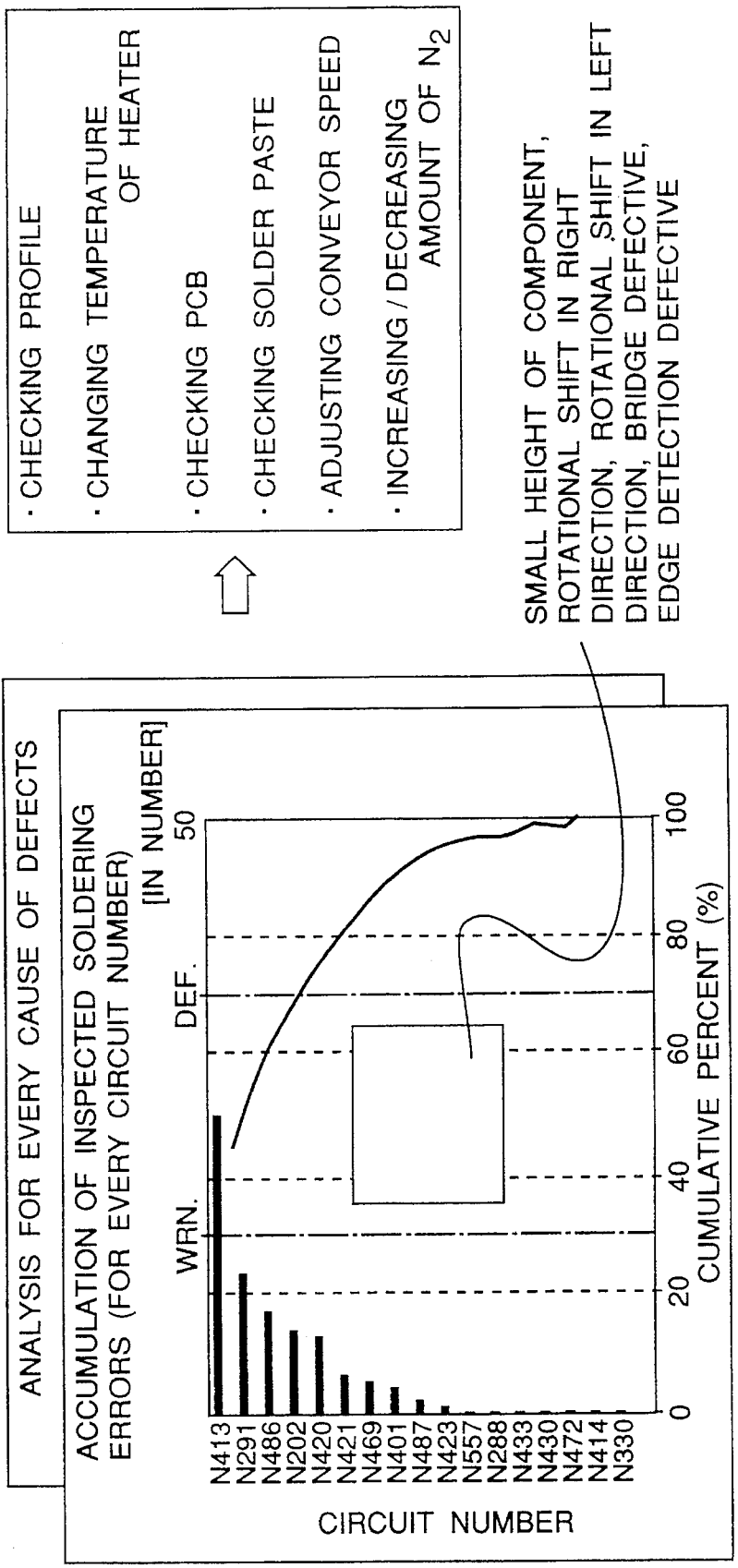
FIG. 11 is a soldering-process monitor chart used in the embodiments.
Figure 12:
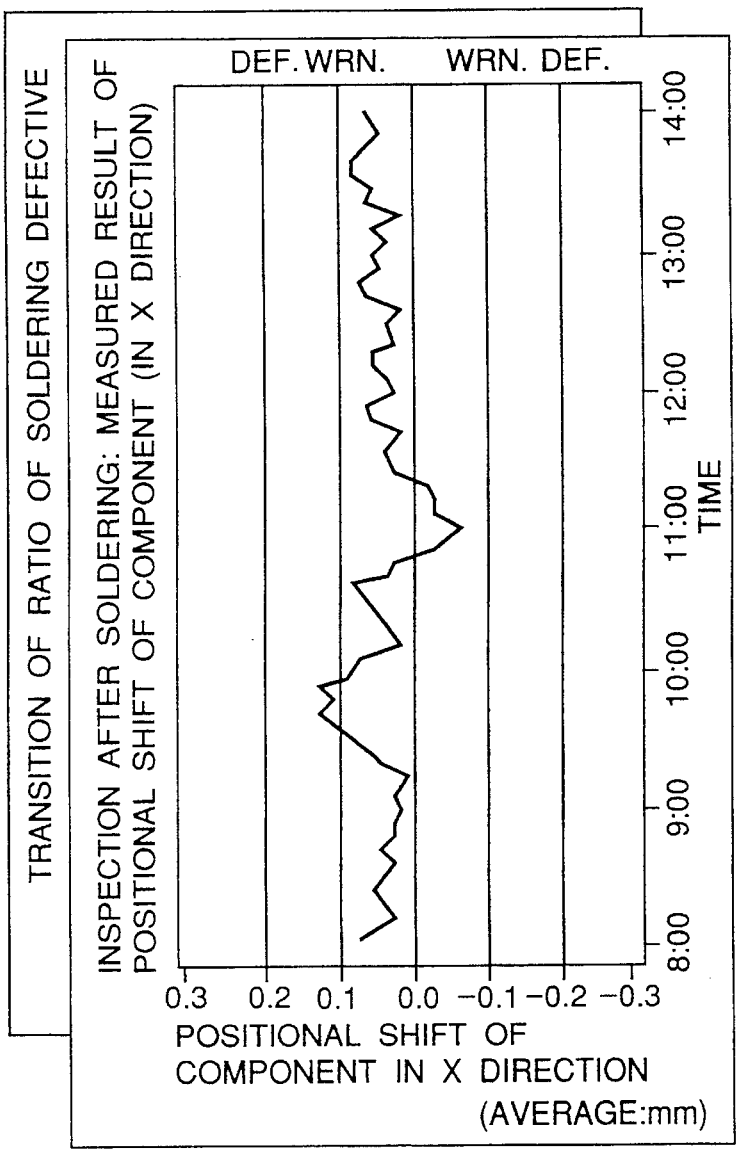
FIG. 12 is a soldering-process monitor chart used in the embodiments.
Figure 13:
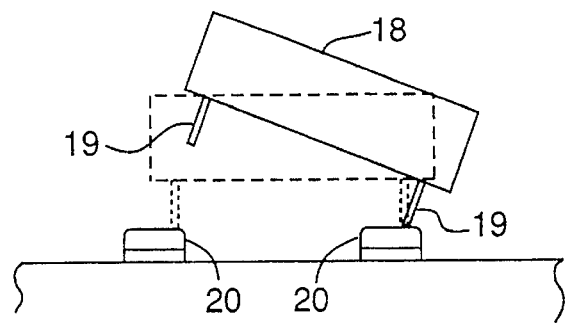
FIG. 13 is a side view of a chip orientation defect.
Figure 14:
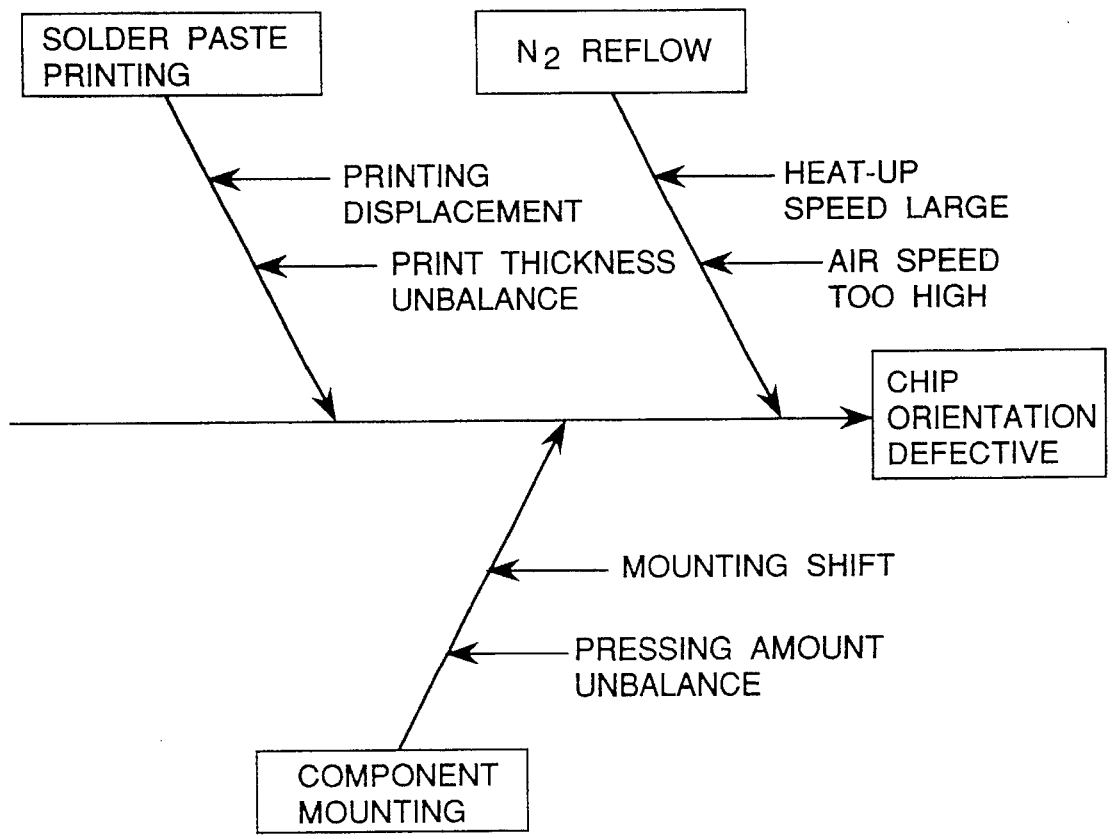
FIG. 14 is an analytical diagram with respect to factors for chip orientation defects.
Figure 15:
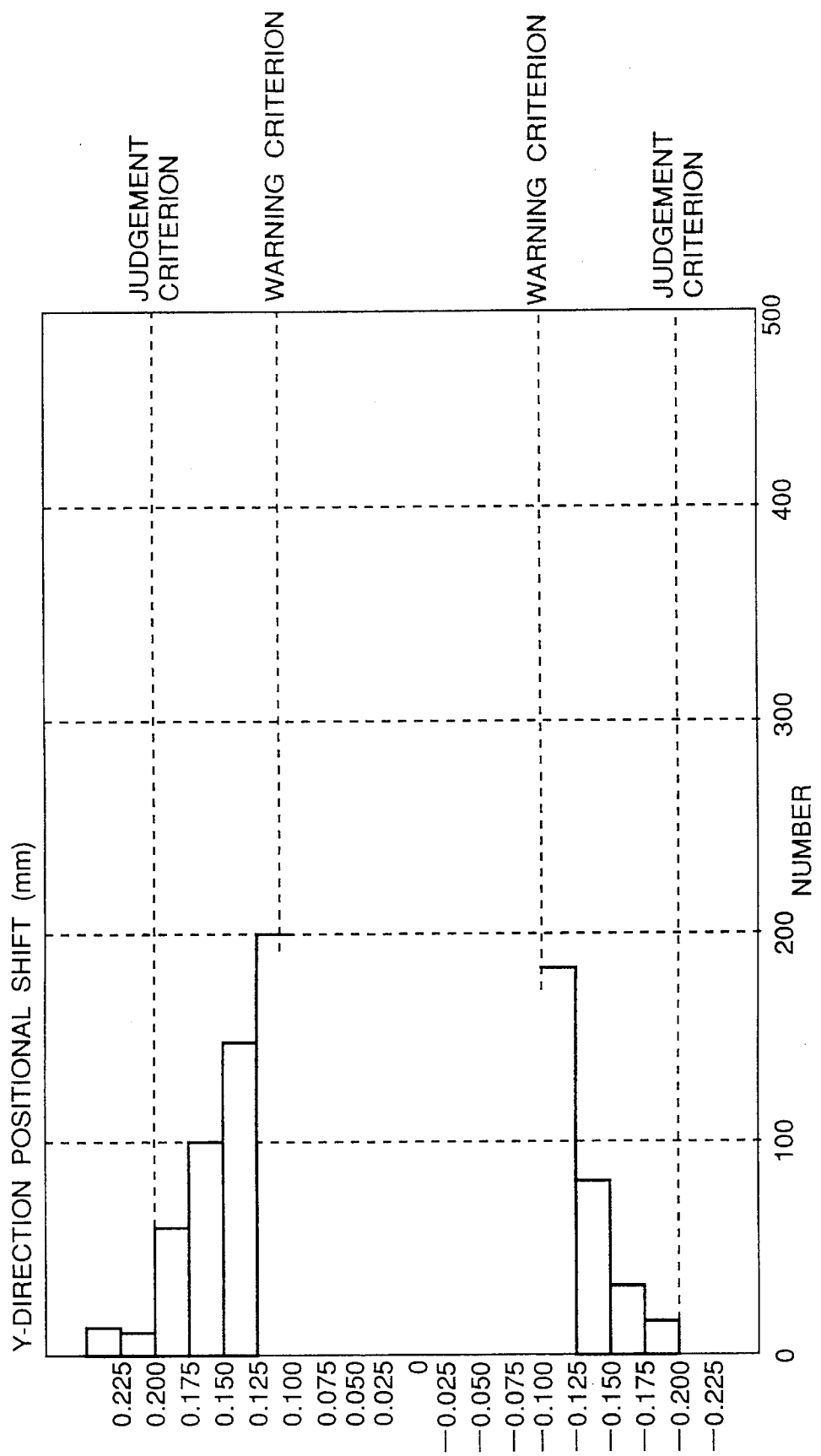
FIG. 15 is an inspection measured distribution chart used in the embodiments.
Figure 17:
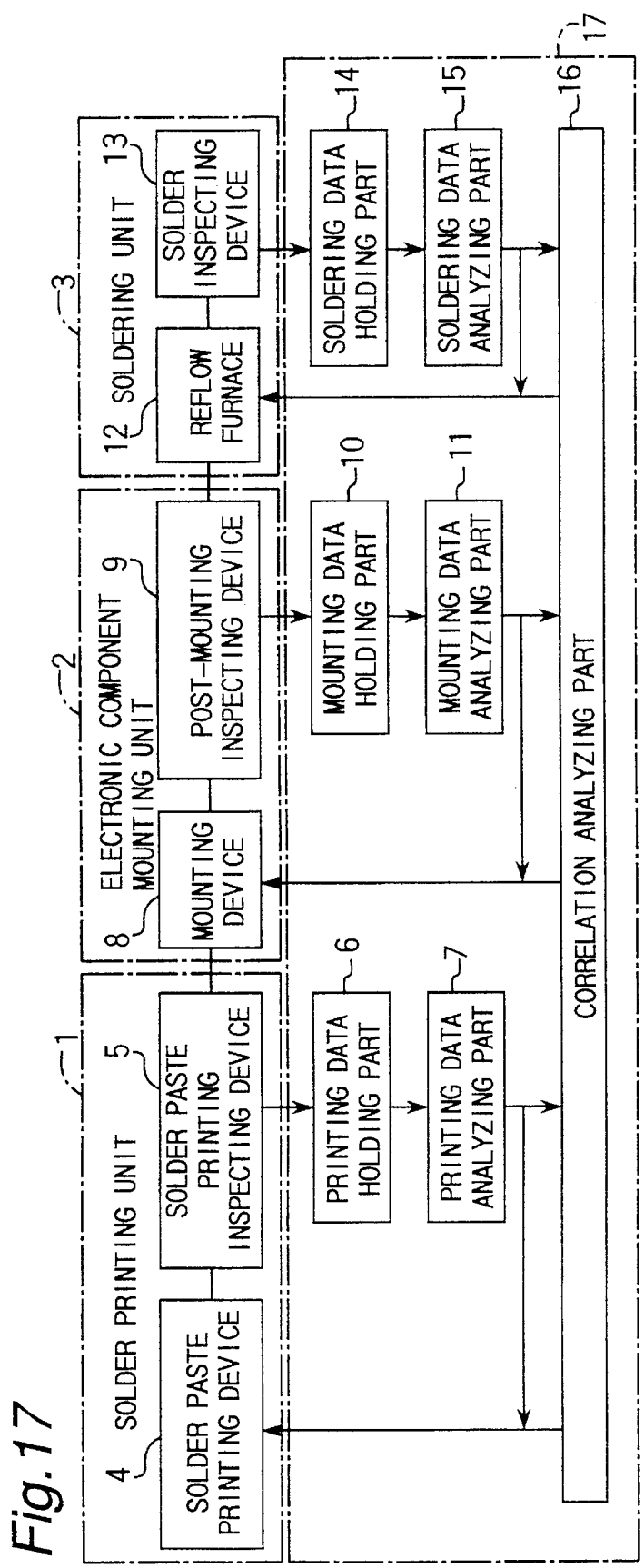
FIG. 17 is a block diagram showing a prior art arrangement.

For each of the solder printing units 21, 22, each of the printing data holding parts 31, 32 collects and holds inspection data on monitor items at each of the solder paste printing inspecting devices 29, 30, and each of the printing data analyzing parts 33, 34 carries out collective analyses and time series analyses, by monitor items, by circuits, and by equipment units, with respect to inspection data on monitor items which are held by each of the printing data holding parts 31, 32. Thus, as FIG. 6 shows, particulars as to equipment condition at, and quality aspect of circuit boards at each of the solder printing units 21, 22 are grasped on the basis of the results of comparison of data obtained from such analyses with predetermined warning criteria for respective monitor items.

For each of the component mounting units 23, 24, each of the mounting data holding parts 39, 40 collects and holds inspection data on monitor items at each of the post-mounting inspecting devices 37, 38, and each of the mounting data analyzing parts 41, 42 carries out collective analyses and time series analyses, by monitor items, by circuits, and by equipment units, with respect to inspection data on monitor items which are held by each of the mounting data holding parts 39, 40. Thus, as FIG. 6 shows, particulars as to equipment condition at, and quality aspect of circuit boards at each of the component mounting units 23, 24 are grasped on the basis of the results of comparison of data obtained from such analyses with predetermined warning criteria for respective monitor items.

For each of the soldering units 25, 26, each of the soldering data holding parts 47, 48 collects and holds inspection data on monitor items at each of the soldering inspecting devices 45, 46, and each of the soldering data analyzing parts 49, 50 carries out collective analyses and time series analyses, by monitor items, by circuits, and by equipment units, with respect to inspection data on monitor items which are held by each of the soldering data holding parts 47, 48. Thus, as FIG. 6 shows, particulars as to equipment condition at, and quality aspect of circuit boards at each of the soldering units 25, 26 are grasped on the basis of the results of comparison of data obtained from such analyses with predetermined warning criteria for respective monitor items.

The manner of quality control operation according to the warning criteria shown in FIG. 6 will be explained hereinbelow. Between a normal region and an NG region beyond a criterion for judgement of defects there is established a warning criterion, and the region between the judgement criterion and the warning criterion is taken as a warning region. With respect to inspection data on a monitor item, a detection is made whether the data has entered the warning region across the warning criterion. In case of such an entry having been made, operation of equipment is controlled so that operation can quit the warning region to return to the normal region.

Examples are shown in FIGS. 7 to 12. With respect to FIGS. 7 to 12, description is omitted because they are described in the conventional arrangement.

The present embodiment is identical with the prior art arrangement up to the foregoing extent. The correlation analyzing part 51, unlike the correlation analysis section 16 of the prior art arrangement, combines with the inspection data holding part and the inspection data analyzing part for each of the A- and B-lines to constitute the control means 52. On the basis of the inspection data analysis results from the inspection data analyzing part of each process of the A- and B-lines and of the results of correlation analysis obtained by the correlation analyzing part 51 after carried out correlation analysis based on the inspection data analysis results, the control means 52 will feed-back control the respective processes over plural A- and B-lines.

An example is shown in FIGS. 13 to 16. With respect to FIGS. 13 to 16, description is omitted because they are described in the conventional arrangement. The control means 52 of the present embodiment is different in that control is made not only within respective lines but over a plurality of lines.

On the basis of various comparison results including those of comparison between inspection data and warning criteria with respect to monitor items, and those of comparison between such inspection data and warning criteria with respect to various combinations of monitor items, the control means 52 will provide maintenance needs for equipment units necessitating such warnings, by alarm buzzer or display monitor.

The control means 52 will perform collective analysis of various inspection data, by monitor items, by circuit numbers, by equipment units, and time series analyses thereof, and sequentially incorporate such analysis results and inter-process correlation data obtained through correlation analysis based on the analysis results into a data base and, where necessary, may conduct a search for necessary data, monitor-display and/or copy out the data.

In particular, the present embodiment is useful in the case where a wide variety of products are to be manufactured in small quantities, such that circuit boards of same kind flowing in A- and B-lines 53, 54 are limited in a small number so that only with inspection data available from respective lines, samples available are insufficient to provide analysis data that can support high quality production. Correlations are to be analyzed with analysis results shown in FIGS. 7–12 based on inspection data obtained in A-line 53 relative to analysis results shown in FIGS. 7–12 based on inspection data obtained in B-line 54, and on the basis of any correlation found, for example, the analysis results based on the inspection data obtained at B-line 54 are considered in the analysis results based on the inspection data obtained at A-line 53, whereby there is an increase in the quantity of available inspection data, which provides sufficient analysis data for supporting quality production.

Figure 2:
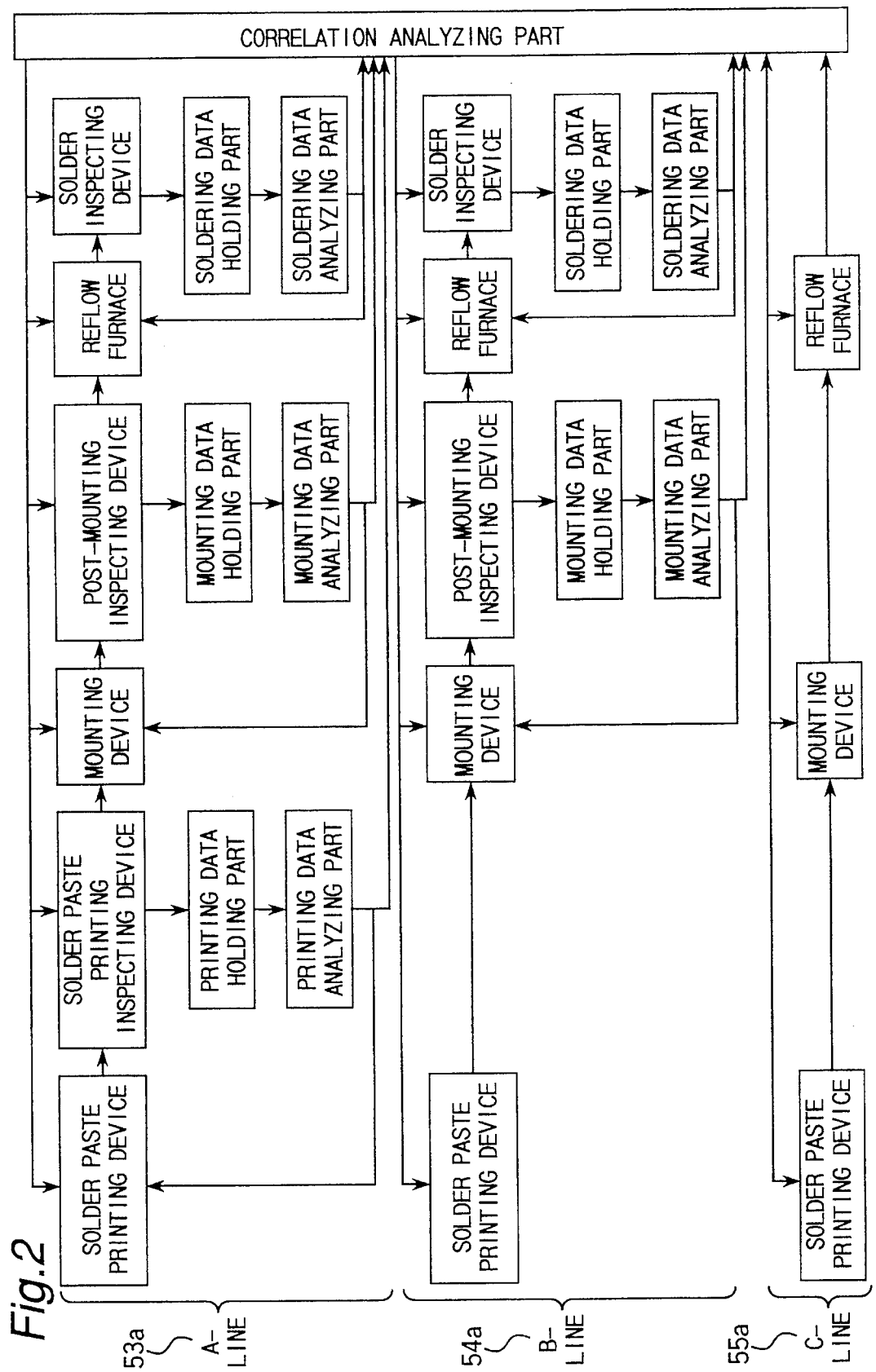
FIG. 2 is a block diagram showing the arrangement of a second embodiment of the invention.

FIG. 2 illustrates the arrangement of a second embodiment of the invention which comprises a plurality of mounted circuit board production line groups.

In the FIG. 2 embodiment, there are three lines of production equipment of same functions, including A-line 53a, B-line 54a, and C-line 55a, whereas FIG. 1 arrangement representing the first embodiment includes two lines, A- and B-lines. The solder paste printing unit of B-line 54a comprises a solder paste printing device only. In C-line 55a, the solder printing unit, component mounting unit, and soldering unit include a solder paste printing device, a mounting device, and a reflow furnace respectively. Whereas the first embodiment 1 of FIG. 1 is of such arrangement that control instructions from the correlation analyzing part are given only to solder paste printing devices, mounting devices, and reflow furnaces, the arrangement of the FIG. 2 embodiment is such that control instructions from the correlation analyzing part are given to all equipment of individual production lines.

Respective production equipments of A-line 53a, B-line 54a, and C-line 55a is of same function as earlier described. Therefore, fundamental production conditions at respective processes are common with respect to circuit boards of identical type. For example, operations at the solder printing unit, such as print offset changing, print pressure adjustment, temperature check, and cleaning operation for screen, are common to all production lines. Operations at the component mounting unit, such as nozzle cleaning, nozzle check, reference pin check are common to all production lines. Operations at the soldering unit, such as profile check, heater temperature changing, conveyor speed adjusting, and $N_2$ amount increasing or decreasing, are common to all production lines.

Therefore, any control which the correlation analyzing part may extend to the A-line 53a with respect to the foregoing common production conditions can be applied directly to the solder paste printing device of the B-line 54a or the solder paste printing device, the mounting device, or the reflow furnace of the C-line 55a. Thus, it is possible to control not only the solder paste printing device at the B-line 54a, but also the solder paste printing device, the mounting device, and the reflow furnace at the C-line 55a with respect such fundamental production conditions.

Figure 3:
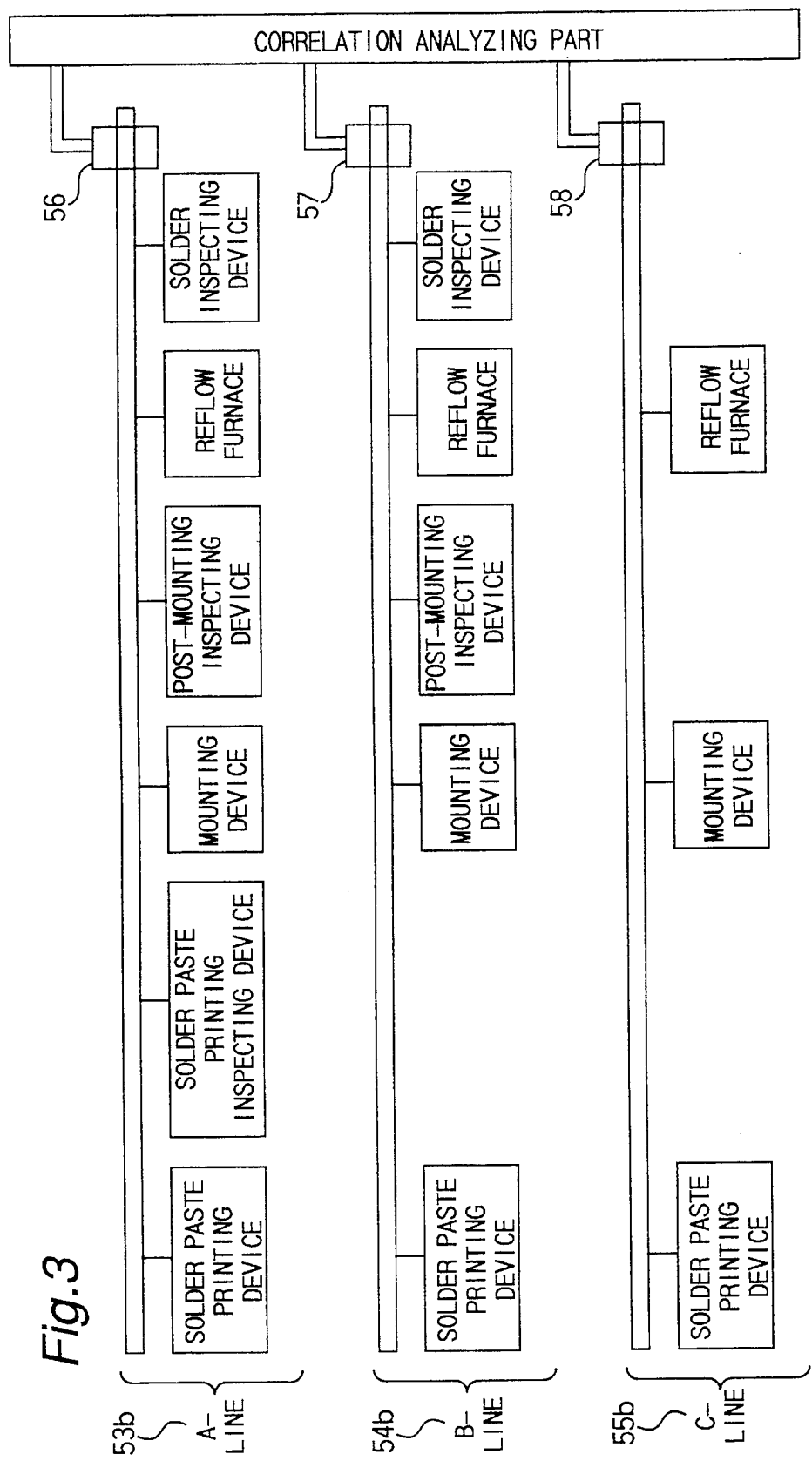
FIG. 3 is a block diagram showing the arrangement of a third embodiment of the invention.

Next, FIG. 3 illustrates a third embodiment of mounted circuit board production lines of the invention.

In the embodiment shown in FIG. 3, a change detection means comprise a means for detecting changes made in operation programs and libraries with respect to the equipment at one of the solder printing unit, component mounting unit, and soldering unit, and changes in conditions for production of circuit boards to be mounted, and changes in inspection conditions; and a notification means for notifying, to associated equipment, predetermined for various types of changes, of particulars detected by the change detection means, changes which are based on changes in operation programs and libraries, and on changes in conditions for production of circuit boards to be mounted, and on changes in inspection conditions.

FIGS. 4 and 5 show update designation files preset as to how changes be taught to what equipment unit by the notification means, on the basis of changes made in operation programs and libraries with respect to any equipment as detected by the change detection means of FIG. 3, and changes in conditions for production of circuit boards to be mounted, and changes in inspection conditions.

In FIG. 4, when an operating program for an equipment unit called SPPA-1 is changed, the change is notified to SPPB-1, etc. as listed in update designation files by-machine group to enable them to make such change.

In FIG. 5, when a change in NC data of MsH-A1 is detected, the change is notified to MsH-A2, MsH-B1, MVII-B2, etc. so as to cause their NC data to be changed accordingly.

The mounted circuit board producing system according to the first aspect of the invention is such that the data analyzing part analyses inspection data, according to the warning criterion and until reaching the preset defect judgement criterion, to obtain analysis data on the quality status of the equipment and circuit boards. Then, on the basis of the analysis data thus obtained, the control means foresees defective production occurrence and executes defect preventive measures, over the entire production lines, with respect to previously reviewed factors for possible defects before there may occur any defective production. In this way, any defect occurrence can be effectively prevented over all the production lines.

The control means will, on the basis of analysis results of inspection data of monitor items at each production line relative to the relevant warning criterion, analyze the correlation of any anticipated cause of defect at each process with defect occurrences with respect to each monitor item, and exercise control on the basis of the correlation thus established. This makes it possible to effectively prevent any possible defect occurrences over all the production lines.

In the mounted circuit board producing system according to the second aspect of the invention, a change detection means will detect changes made in operation programs and libraries with respect to any equipment, changes in conditions for production of circuit boards to be mounted, and changes in inspection conditions, and a notification means will notify associated equipment, predetermined for various types of changes, of particulars detected by the change detection means. Therefore, when such change is made in an arbitrary production line, changes in the other production lines will be automatically made advantageously.

The mounted circuit board producing system according to the first aspect of the invention performs inspections with respect to predetermined monitor items for equipment and circuit boards to be mounted, by means of inspection means provided in at least one of the solder printing unit, the component mounting unit and the soldering unit which are constituent members of each line. Thus, inspection data can be obtained with respect to the predetermined monitor items. The inspection data are analyzed by the data analyzing part according to the warning criteria, until predetermined defective judgement criterion has been reached, with the result that analysis data including qualitative analysis with respect to the equipment and circuit boards are obtained. According to such analysis data which include analyses made on the basis of the warning criterion, it is possible to determine whether the product in process is stable in quality, or whether any defect may occur if such quality condition is allowed to stand, prior to the occurrence of such defect. Therefore, if a decision is made that there is any possibility of defect occurrence, the control means will, on the basis of data analysis results with respect to the inspection data on the monitor items, carry out control measures for preventing defect occurrences due to previously reviewed factors for defects with respect to the monitor items in respective processes, over all the production lines and with respect to at least one of the solder printing unit, component mounting unit, and the soldering unit. In this way, possible occurrence of any defect with respect to any monitor item can be prevented.

Where inspection results with respect to monitor items are in excess of the warning criterion but within a warning region of lower than the defect judgement criterion, the control means may carry out, over all the productions lines, control measures for changing the conditions of operation with respect to equipment unit downstream of the inspection process in which inspection results have exceeded the warning criterion in respect of the monitor item. Then, the downstream process can be prevented from being adversely affected by the fact that the monitor item is in excess of the warning criterion. Also, control measures may be effected for changing the condition of operation with respect to equipment unit upstream of the inspection process for the monitor item on which inspection results have exceeded the warning criterion, it being thus possible to carry out sound measures for preventing any defect occurrence.

The control means may control the equipment for a change of operation, not only on the basis of comparison of inspection data on a singly monitor item with the warning criterion but also on the basis of comparison of inspection data on plural monitor items with relevant warning criterions. This arrangement provides for an increase in the amount of available data, as well as for improvement in quality control sensitivity and accuracy.

The control means may, on the basis of analysis results of inspection data of the monitor item at each production line relative to the relevant warning criterion, analyze the correlation of any anticipated cause of defect at each process with defect occurrences with respect to each monitor item, and exercise control on the basis of the correlation thus established. This provides for control of defect-related factors present over all the production lines toward the prevention of any defect occurrence of the monitor item.

In the mounted circuit board producing system according to the second aspect of the invention, change detection means will detect changes made in operation programs and libraries with respect to the equipment at one of the solder printing unit, component mounting unit, and soldering unit, changes in conditions for production of circuit boards to be mounted, and changes in inspection conditions, and notification means will notify associated equipment, predetermined for various types of changes, of particulars detected by the change detection means including changes which are based on changes in operation programs and libraries, and on changes in conditions for production of circuit boards to be mounted, and on changes in inspection conditions. Mounted circuit board producing groups of lines are of such arrangement that each group of lines includes a plurality of production lines having equipment units and inspection units of same function. When any change is to be made in operating programs and libraries relative to equipment, in the conditions of manufacturing with respect to circuit boards to be mounted, and also in the conditions of inspection with such circuit boards, such change may be carried out for any one production line, automatically followed by similar changes for other production lines.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A mounted circuit board producing system including a plurality of mounted circuit board production lines having a solder printing unit, a component mounting unit, and a soldering unit, the system comprising:

inspection means for inspecting at least one equipment at the solder printing unit, component mounting unit, and soldering unit and given monitor items with respect to circuit boards to be mounted;

a data analyzing part for analyzing, according to a warning criterion applicable prior to a predetermined defective judgement criterion being reached, qualitative conditions of both the equipment and individual circuit boards from results of inspections made by the inspection means; and control means for controlling, on the basis of analysis results at the data analyzing part, at least one of the solder printing unit, component mounting unit, and soldering unit for a change of operating conditions over the entire production line.

2. The mounted circuit board producing system as defined in claim 1, wherein the control means is operative, when the inspection results are in a warning region which exceeds an upper limit of the warning criteria but is lower than the defective judgement criterion, to control for a change of operating condition over the entire production line equipment located downstream of an inspection process relating to a monitor item for which the inspection results exceed the upper limit of the warning criteria, or to control for a change of operating condition over the entire production line equipment located upstream of the inspection process relating to the monitor item for which the inspection results exceeds the upper limit of the warning criteria.

3. The mounted circuit board producing system as defined in claim 1, wherein the control means is operative to control equipment for a change of operating condition on the basis of the results of comparison with the warning criteria of the inspection result as to a single monitor item, or of the results of comparison with the warning criteria of the inspection results as to a combination of plural monitor items.

4. The mounted circuit board producing system as defined in claim 2, wherein the control means is operative to control equipment for a change of operating condition on the basis of the results of comparison with the warning criteria of the inspection result as to a single monitor item, or of the results of comparison with the warning criteria of the inspection results as to a combination of plural monitor items.

5. A mounted circuit board producing system as defined in claim 1, wherein the control means is operative to analyze, on the basis of analysis results with respect to inspection results on monitor items obtained at each production line relative to the warning criteria, correlations of an anticipated defective factor at each process of operation with defect occurrences as to each monitor item, and to control, on the basis of the correlations discovered, each equipment over the entire production line and toward eliminating any defective factor having a correlation with the defect occurrences as to the monitor item.

6. A mounted circuit board producing system as defined in claim 2, wherein the control means is operative to analyze, on the basis of analysis results with respect to inspection results on monitor items obtained at each production line relative to the warning criteria, correlations of an anticipated defective factor at each process of operation with defect occurrences as to each monitor item, and to control, on the basis of the correlations discovered, each equipment over the entire production line and toward eliminating any defective factor having a correlation with the defect occurrences as to the monitor item.

7. A mounted circuit board producing system as defined in claim 3, wherein the control means is operative to analyze, on the basis of analysis results with respect to inspection results on monitor items obtained at each production line relative to the warning criteria, correlations of an anticipated defective factor at each process of operation with defect occurrences as to each monitor item, and to control, on the basis of the correlations discovered, each equipment over the entire production line and toward eliminating any defective factor having a correlation with the defect occurrences as to the monitor item.

8. A mounted circuit board producing system as defined in claim 4, wherein the control means is operative to analyze, on the basis of analysis results with respect to inspection results on monitor items obtained at each production line relative to the warning criteria, correlations of an anticipated defective factor at each process of operation with defect occurrences as to each monitor item, and to control, on the basis of the correlations discovered, each equipment over the entire production line and toward eliminating any defective factor having a correlation with the defect occurrences as to the monitor item.

9. A mounted circuit board producing system including a plurality of mounted circuit board production lines having a solder printing unit, a component mounting unit, and a soldering unit, the system comprising:
 change detection means for detecting a change made in an operation program and/or a library with respect to equipment at one of the solder printing unit, component mounting unit, and soldering unit, a change in a condition for production of circuit boards to be mounted, and a change in an inspection condition; and
 notification means for notifying associated equipment, predetermined for various types of changes, of particulars detected by the change detection means including changes which are based on the changes in the operation program and/or the library, and on the changes in condition for production of circuit boards to be mounted.

* * * * *